United States Patent
Do et al.

(10) Patent No.: US 8,975,131 B2
(45) Date of Patent: Mar. 10, 2015

(54) SELF-ALIGNED METHOD OF FORMING A SEMICONDUCTOR MEMORY ARRAY OF FLOATING GATE MEMORY CELLS WITH SINGLE POLY LAYER

(71) Applicants: Nhan Do, Saratoga, CA (US); Vipin Tiwari, Dublin, CA (US); Hieu Van Tran, San Jose, CA (US); Xian Liu, Sunnyvale, CA (US)

(72) Inventors: Nhan Do, Saratoga, CA (US); Vipin Tiwari, Dublin, CA (US); Hieu Van Tran, San Jose, CA (US); Xian Liu, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/631,474

(22) Filed: Sep. 28, 2012

(65) Prior Publication Data

US 2014/0094011 A1  Apr. 3, 2014

(51) Int. Cl.
*H01L 21/8238* (2006.01)
(52) U.S. Cl.
USPC ........ 438/211; 438/257; 438/593; 257/E29.3; 257/21.179

(58) Field of Classification Search
USPC ........ 438/211, 257, 593; 257/E29.3, E21.179
See application file for complete search history.

(56) References Cited

U.S. PATENT DOCUMENTS

| 5,572,054 A | 11/1996 | Wang et al. | |
| 2008/0293198 A1* | 11/2008 | Kojima et al. | 438/259 |
| 2009/0096015 A1* | 4/2009 | Io | 257/324 |

OTHER PUBLICATIONS

PCT Search Report and Written Opinion dated Oct. 4, 2013 corresponding to the related PCT Patent Application No. US13/52866.

* cited by examiner

*Primary Examiner* — Julia Slutsker
(74) *Attorney, Agent, or Firm* — DLA Piper LLP (US)

(57) ABSTRACT

A method of forming a semiconductor memory cell that includes forming the floating and control gates from the same poly layer. Layers of insulation, conductive and second insulation material are formed over a substrate. A trench is formed in the second insulation material extending down to and exposing the conductive layer. Spacers are formed in the trench, separated by a small and defined gap at a bottom of the trench that exposes a portion of the conductive layer. A trench is then formed through the exposed portion of the conductive layer by performing an anisotropic etch through the gap. The trench is filled with third insulation material. Selected portions of the conductive layer are removed, leaving two blocks thereof separated by the third insulation material.

7 Claims, 8 Drawing Sheets

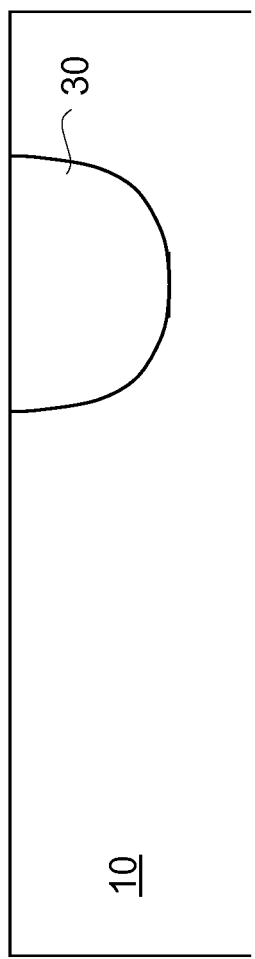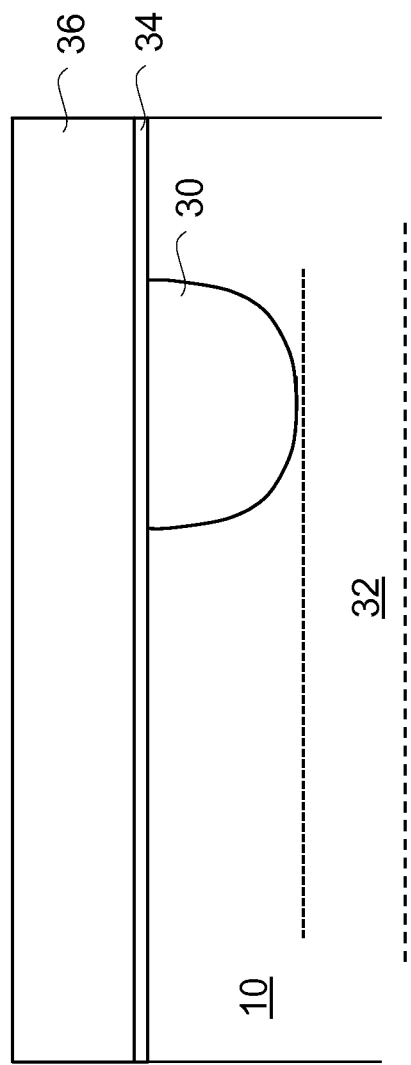

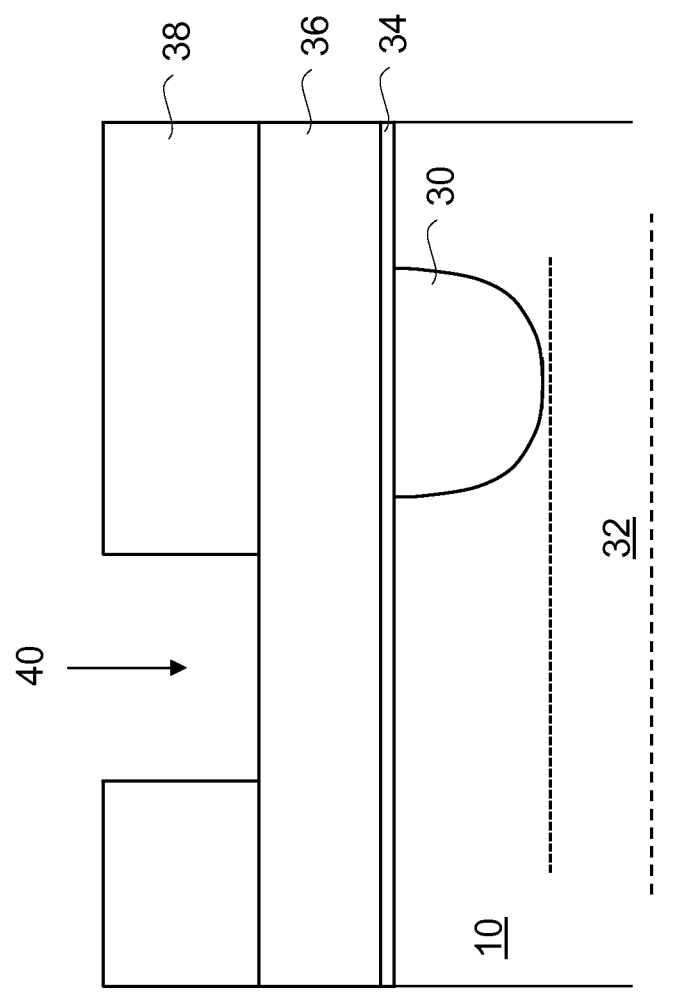

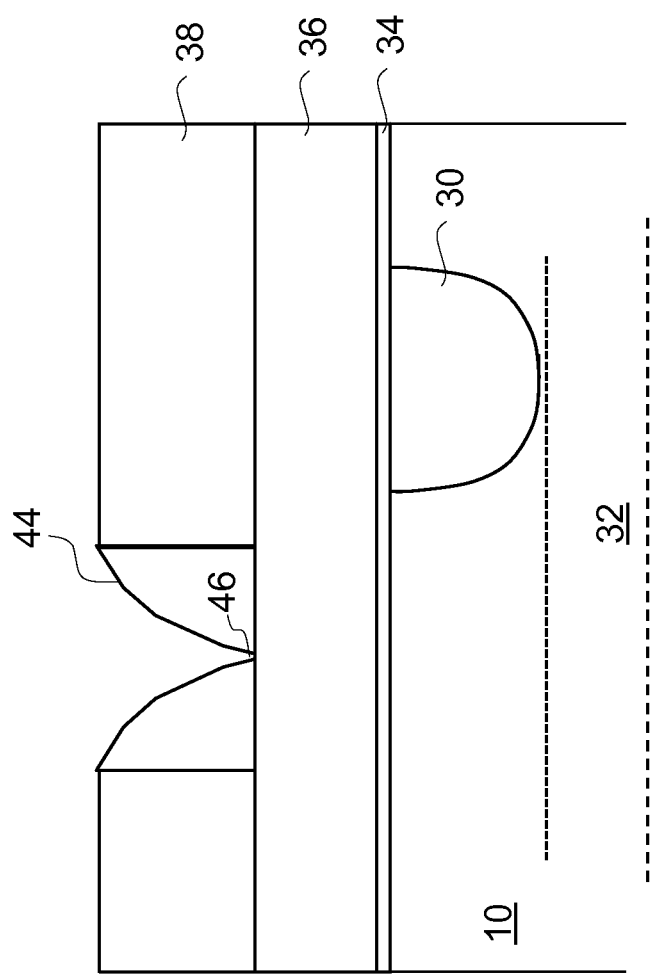

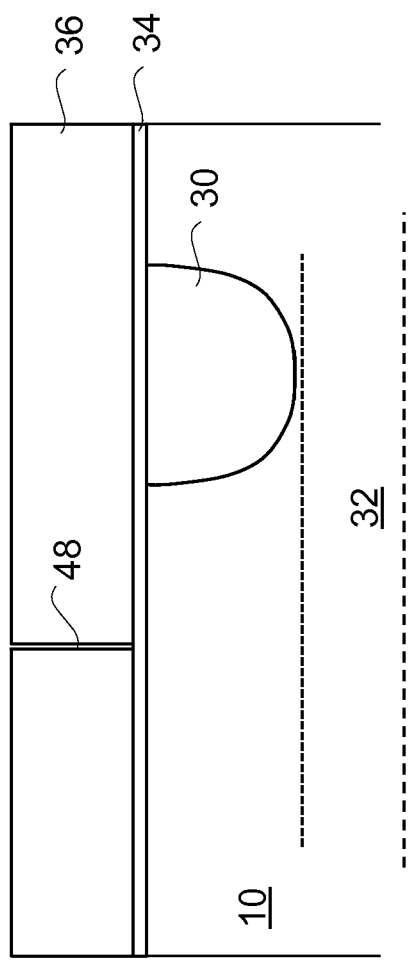

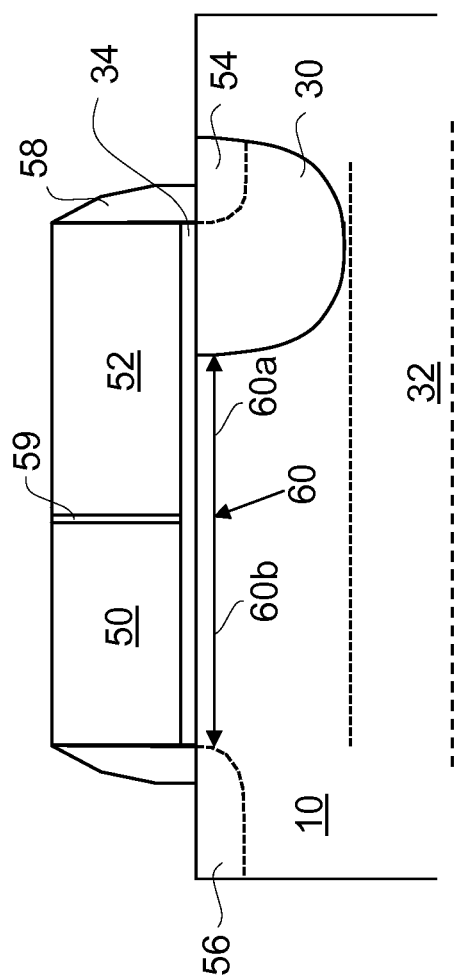

SELF-ALIGNED METHOD OF FORMING A SEMICONDUCTOR MEMORY ARRAY OF FLOATING GATE MEMORY CELLS WITH SINGLE POLY LAYER

FIELD OF THE INVENTION

The present invention relates to a self-aligned method of forming a semiconductor memory cell.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the split gate type.

There is a constant need to shrink the size of the memory cell arrays in order to maximize the number of memory cells on a single wafer. It is well known that forming split gate type memory cells to form the control gate and floating gate laterally adjacent to each other and over the substrate. However, separate gate formation processes are typically used to form the floating gate and the control gate. Separate formation processes require additional photo lithography masks and masking steps. Additionally, as memory cells are scaled down in size, it becomes increasingly difficult to align the two gates to each other, as well as accurately control the thickness of the insulation layer separating the two gates from each other.

There is a need for an improved technique in forming the floating gate and control gate for a split gate, non-volatile memory cell.

BRIEF SUMMARY OF THE INVENTION

A method of forming a split gate, non-volatile memory cell includes forming a first insulation layer of material on a substrate, forming a conductive layer of material on the first insulation layer, forming a second insulation layer of material on the conductive layer, forming a first trench in the second insulation layer that extends down to and exposes the conductive layer, forming spacers in the first trench that are separated by a gap at a bottom of the first trench that exposes a portion of the conductive layer, forming a second trench through the conductive layer by performing an anisotropic etch through the gap, selectively removing portions of the conductive layer in a manner that leaves first and second blocks of the conductive layer of material which are separated from each other by the second trench, filling the second trench with insulation material, and forming first and second spaced-apart regions in the substrate, with a channel region in the substrate therebetween, wherein the first and second regions have a first conductivity type and the channel region has a second conductivity type different from the first conductivity type, and wherein the channel region includes a first portion under the first block and a second portion under the second block.

Other objects and features of the present invention will become apparent by a review of the specification, claims and appended figures.

BRIEF DESCRIPTION OF THE DRAWINGS

FIGS. 2A-2H are cross sectional views of the semiconductor structure in FIG. 1F taken along the line 2A-2A showing in sequence the steps in the processing of the semiconductor structure in the formation of a non-volatile memory array of floating gate memory cells.

DETAILED DESCRIPTION OF THE INVENTION

The method of forming the non-volatile memory device is illustrated in FIGS. 1A to 1F and 2A to 2H. The method begins with a semiconductor substrate 10, which is preferably of P type and is well known in the art.

Isolation Region Formation

Figure 1A:
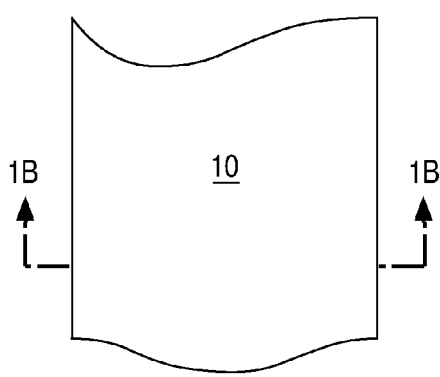
FIG. 1A is a top view of a semiconductor substrate used in forming isolation regions.
Figure 1B:
FIG. 1B is a cross sectional view of the structure taken along the line 1B-1B showing the initial processing steps of forming isolation and active regions.

FIGS. 1A to 1F illustrate the well known STI method of forming isolation regions on a substrate. Referring to FIG. 1A there is shown a top plan view of a semiconductor substrate 10 (or a semiconductor well thereof), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD). Nitrogen doped oxide or other insulation dielectrics can also be used. Second layer 14 can be silicon nitride (hereinafter "nitride"), which is formed over oxide layer 12 preferably by CVD or PECVD. FIG. 1B illustrates a cross-section of the resulting structure.

Figure 1D:
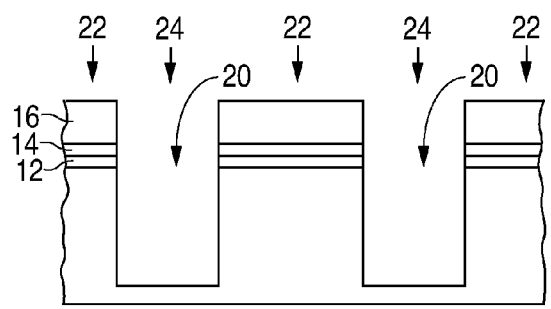
FIG. 1D is a cross sectional view of the structure in FIG. 1C taken along the line 1D-1D showing the isolation trenches formed in the structure.
Figure 1C:
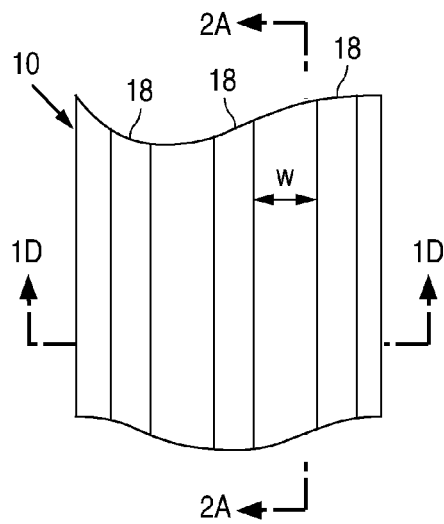
FIG. 1C is a top view of the structure showing the next step in forming isolation and active regions.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10, as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
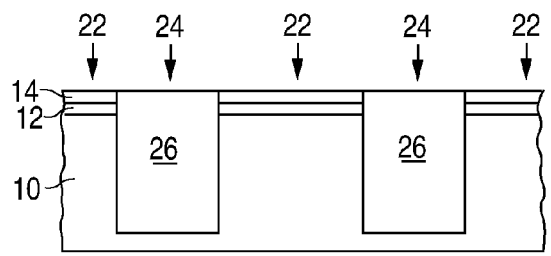
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing (CMP) etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed (e.g. grown) on exposed portions of the substrate surface in stripe regions 18. FIGS. 1A to 1F illustrate the memory cell array region of the substrate, in which columns of memory cells will be formed in the active regions 22 which are separated by the isolation regions 24.

Memory Cell Formation

Figure 1F:
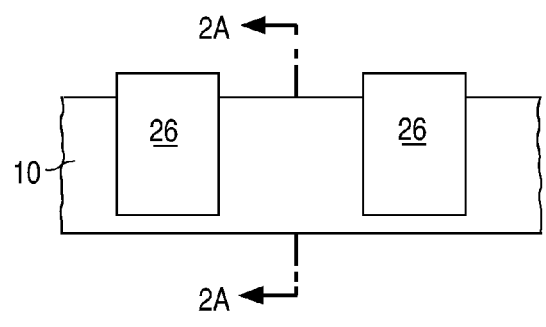
FIG. 1F is a cross sectional view of the structure in FIG. 1E showing the final structure of the isolation regions.
Figure 2D:
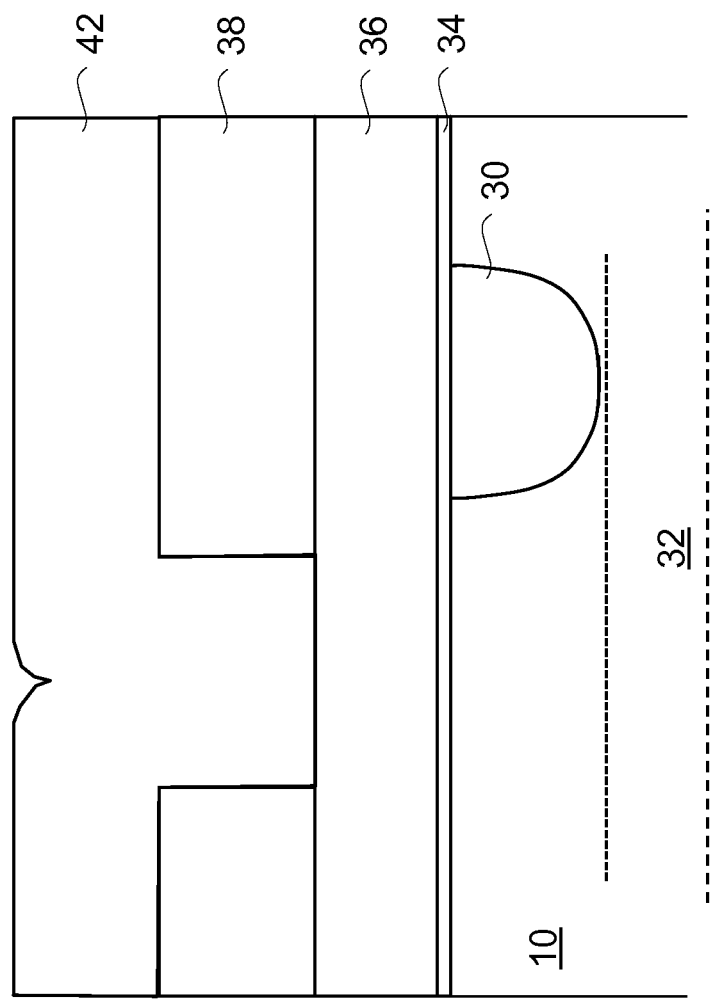

The structure shown in FIG. 1F is further processed as follows to form non-volatile memory cells. FIGS. 2A to 2H show the cross sections of the structure in the active regions 22 from a view orthogonal to that of FIG. 1F (along line 2A-2A as shown in FIGS. 1C and 1F), as the next processing steps are performed. As illustrated in FIG. 2A, an NWEL region 30 (logic well region for a P type transistor) is formed by implanting an N type material in the substrate 10 using a convention implant process to form a deep source junction. An MWEL masking and implant process is performed to define a memory well 32 below the surface of the substrate. An insulation layer 34 (preferably oxide) is formed over the substrate 10 (e.g. by deposition or thermal oxidation growth). A non-limiting exemplary thickness for layer 34 is 80-200 Å. A layer of polysilicon 36 (hereinafter "poly") is formed over the oxide layer 34 (e.g. by poly deposition). The resulting structure is illustrated in FIG. 2B.

An insulation layer 38 (e.g. nitride) is formed over the poly layer 36 (e.g. by nitride deposition). A photo lithographic etch process is next performed, where suitable photo resist material is applied on the nitride layer 38, and a masking step is performed to selectively remove the photo resist material and selectively expose certain portions of nitride layer 38. An anisotropic nitride etch is then performed to remove the exposed portions of the nitride layer 38, thus creating trenches 40 that extend down to and selectively expose poly layer 36. The resulting structure is illustrated in FIG. 2C.

A layer 42 of insulation material is then formed over the structure (i.e. on nitride layer 38 and filing trenches 40), as illustrated in FIG. 2D. Preferably layer 42 is oxide. An oxide anisotropic etch is then used to remove oxide 42 except for spacers 44 of the material along the sidewalls of trenches 40. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 44 are formed such that they are separated by a small but well defined gap 46 at the top surface of poly layer 36. As a non-limiting example, the width of gap 46 can be 150-2000 Å. The resulting structure is illustrated in FIG. 2E.

Figure 2F:
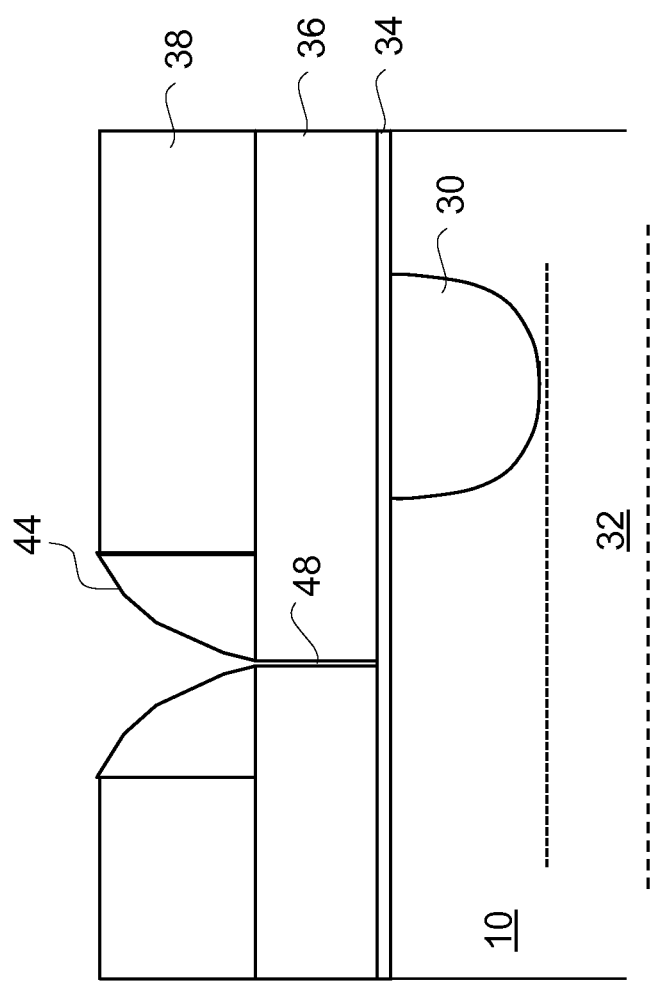

A poly etch with very high selectivity with oxide is performed to remove the exposed portion of poly layer 36 underneath gap 46, resulting in a trench 48 extending through poly layer 36 down to oxide layer 34, as illustrated in FIG. 2F. Trench 48 has approximately the same width as gap 46. A nitride etch is used to remove layer 38, and an oxide etch is used to remove spacers 44, as illustrated in FIG. 2G.

A lithographic poly etch is then used to remove portions of poly layer 36, leaving poly blocks 50 and 52. A suitable ion implantation (and possible anneal) is performed to form N type first (source) region 54 and second (drain) region 56 in the substrate 10 adjacent poly blocks 52 and 50, respectively. Insulation spacers 58 (e.g. oxide) are formed laterally adjacent to and abutting poly blocks 50/52 by an oxide deposition and etch process, which also fills trench 48 with oxide thus forming a thin oxide insulation layer 59 between poly blocks 50/52. The resulting memory cell structure is illustrated in FIG. 2H. Further processing of the memory cell structure of FIG. 2H can include insulation and contact formation, which is well known in the art and not further described herein.

As shown in FIG. 2H, the above described process forms a memory cell having first and second regions 54/56 that constitute the source and drain regions respectively (although those skilled in the art know that source and drain can be switched during operation). Poly block 52 constitutes the floating gate, and poly block 50 constitutes the control gate. Channel region 60 is defined in the surface portion of the substrate 10 that is in-between the source and drain 54/56. The above described method of forming the floating and control gates 50/52 from the same poly layer, and the formation of the thin insulation layer 59 between gates 50/52, is advantageous because it provides greater control on the alignment of gates 50/52 to each other, as well as the greater control of the thickness of the insulation layer 59 therebetween. Moreover, the thickness of layer 59 can be less than the geometries of the lithographic processes used to make the memory cell. The above method is compatible with processes used to make associated logic on the same chip, and reduces the number of lithography masks needed compared to other memory cell formation methods.

While the formation of a single memory cell is shown in the figures and described above, one skilled in the art would understand that an array of such cells are formed simultaneously on the same wafer with the above described method, and in fact can be formed in pairs sharing a drain region or source region. Floating gate 52 controls that portion of the channel region (60a) underneath floating gate 52, and control gate 50 controls that portion of the channel region (60b) underneath control gate 50. The operation and theory of operation of split cell memory cells are described in U.S. Pat. No. 5,572,054, whose disclosure is incorporated herein by reference for all purposes, and in particular with regard to the operation and theory of operation of a non-volatile memory cell having a floating gate and a control gate, tunneling, and an array of memory cells formed thereby.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material who's etch property differs from that of silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. While a P type substrate with N type regions formed therein are disclosed, an N type substrate with P type regions formed therein could alternately be used. Single layers of insulating or conductive material could be formed as multiple layers of such materials, and vice versa. While a pair of spacers 44 are shown in the figures on opposing sides of trench 40, one skilled in the art will appreciate that such spacers can be continuously formed and connected together when formed in holes or trenches. Lastly, the formation of two conductive gates from a single poly layer is disclosed with respect to a memory cell with just the two laterally adjacent gates, the present invention equally applies to memory cells with additional gates (e.g. those memory cell configurations that additionally include a select gate and/or an erase gate) with respect to any two laterally adjacent gates.

What is claimed is:

1. A method of forming a semiconductor memory cell, comprising:
    forming a first insulation layer of material on a substrate;
    forming a conductive layer of material on the first insulation layer;
    forming a second insulation layer of material on the conductive layer;
    forming a first trench in the second insulation layer that extends down to and exposes the conductive layer;
    forming spacers in the first trench that are separated by a gap at a bottom of the first trench that exposes a portion of the conductive layer;
    forming a second trench through the conductive layer by performing an anisotropic etch through the gap;
    selectively removing portions of the conductive layer in a manner that leaves first and second blocks of the conductive layer of material which are separated from each other by the second trench;
    filling the second trench with an insulation material;
    forming first and second spaced-apart regions in the substrate, with a channel region in the substrate therebetween, wherein the first and second regions have a first conductivity type and the channel region has a second conductivity type different from the first conductivity type, and wherein the channel region includes a first portion under the first block and a second portion under the second block; and
    after forming the second trench, completely removing the second insulation layer and the spacers.

2. The method of claim 1, further comprising:
    forming a well region in the substrate by implanting a second conductivity type material in the substrate, wherein the first region is formed in the well region.

3. The method of claim 2, wherein a portion of the second block is disposed over the well region.

4. The method of claim 1, further comprising:
    implanting a material in the substrate to form a well region in the substrate entirely underneath the channel region.

5. The method of claim 1, further comprising:
    forming a spacer of insulation material laterally abutting the first block;
    forming a spacer of insulation material laterally abutting the second block.

6. A method of forming a semiconductor memory cell, comprising:
    forming a first insulation layer of material on a substrate;
    forming a conductive layer of material on the first insulation layer;
    forming a second insulation layer of material on the conductive layer;
    forming a first trench in the second insulation layer that extends down to and exposes the conductive layer;
    forming spacers in the first trench that are separated by a gap at a bottom of the first trench that exposes a portion of the conductive layer;
    forming a second trench through the conductive layer by performing an anisotropic etch through the gap;
    selectively removing portions of the conductive layer in a manner that leaves first and second blocks of the conductive layer of material which are separated from each other by the second trench;
    filling the second trench with an insulation material;
    forming first and second spaced-apart regions in the substrate, with a channel region in the substrate therebetween, wherein the first and second regions have a first conductivity type and the channel region has a second conductivity type different from the first conductivity type, and wherein the channel region includes a first portion under the first block and a second portion under the second block;
    wherein a lateral edge of the second block is aligned to a lateral edge of the first region.

7. A method of forming a semiconductor memory cell, comprising:
    forming a first insulation layer of material on a substrate;
    forming a conductive layer of material on the first insulation layer;
    forming a second insulation layer of material on the conductive layer;
    forming a first trench in the second insulation layer that extends down to and exposes the conductive layer;
    forming spacers in the first trench that are separated by a gap at a bottom of the first trench that exposes a portion of the conductive layer;
    forming a second trench through the conductive layer by performing an anisotropic etch through the gap;
    selectively removing portions of the conductive layer in a manner that leaves first and second blocks of the conductive layer of material which are separated from each other by the second trench;

filling the second trench with an insulation material;
forming first and second spaced-apart regions in the substrate, with a channel region in the substrate therebetween, wherein the first and second regions have a first conductivity type and the channel region has a second conductivity type different from the first conductivity type, and wherein the channel region includes a first pardon under the first block and a second portion under the second block;
wherein a lateral edge of the first block is aligned to a lateral edge of the second region.

* * * * *